(12) United States Patent
Sugiyama et al.

(10) Patent No.: US 9,307,634 B2
(45) Date of Patent: Apr. 5, 2016

(54) CIRCUIT BOARD AND IMAGE FORMING APPARATUS

(71) Applicant: CANON KABUSHIKI KAISHA, Tokyo (JP)

(72) Inventors: Norikazu Sugiyama, Susono (JP); Takahiro Yoneyama, Tokyo (JP); Fumiyuki Yamatsuka, Moriya (JP); Osamu Mukataka, Toride (JP); Kumiko Omori, Abiko (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 65 days.

(21) Appl. No.: 13/895,277

(22) Filed: May 15, 2013

(65) Prior Publication Data
US 2013/0322913 A1 Dec. 5, 2013

(30) Foreign Application Priority Data

May 31, 2012 (JP) ................................. 2012-124689
May 8, 2013 (JP) ................................. 2013-098582

(51) Int. Cl.
*H05K 3/28* (2006.01)
*H05K 1/02* (2006.01)
*G03G 15/00* (2006.01)
*H05K 3/40* (2006.01)

(52) U.S. Cl.
CPC .............. *H05K 1/0296* (2013.01); *G03G 15/80* (2013.01); *H05K 3/4007* (2013.01); *H05K 1/0254* (2013.01); *H05K 2201/09909* (2013.01); *H05K 2203/043* (2013.01)

(58) Field of Classification Search
CPC ... G03G 15/80; H05K 3/4007; H05K 1/0254; H05K 1/0296; H05K 2201/09909; H05K 2203/043

USPC ............ 399/88–90; 439/66, 620.21, 700, 824
See application file for complete search history.

(56) References Cited

U.S. PATENT DOCUMENTS

| | | | |
|---|---|---|---|
| 5,414,223 A | 5/1995 | Suski et al. | |
| 5,952,629 A | 9/1999 | Yoshinaga et al. | |
| 6,201,305 B1 | 3/2001 | Darveaux et al. | |
| 6,333,555 B1* | 12/2001 | Farnworth et al. | 257/737 |
| 2002/0092672 A1 | 7/2002 | Primavera | |
| 2006/0237228 A1 | 10/2006 | Lin et al. | |
| 2007/0132097 A1* | 6/2007 | Wark et al. | 257/737 |
| 2007/0272437 A1 | 11/2007 | Kondo | |
| 2011/0158675 A1* | 6/2011 | Inukai | 399/88 |

FOREIGN PATENT DOCUMENTS

| | | |
|---|---|---|
| CN | 1155369 A | 7/1997 |
| CN | 1852636 A | 10/2006 |

(Continued)

OTHER PUBLICATIONS

Chinese Office Action dated Sep. 21, 2015 for counterpart Chinese Patent Appln No. 201310202644.4.

*Primary Examiner* — Walter L Lindsay, Jr.
*Assistant Examiner* — Jessica L Eley
(74) *Attorney, Agent, or Firm* — Fitzpatrick, Cella, Harper & Scinto (57) ABSTRACT

The circuit board includes a contact for supplying power, in which the contact includes plural copper foil patterns each having a predetermined width, the plural copper foil patterns being formed radially from a center of the contact and connected to each other at the center of the contact. Accordingly, it is possible to enhance contact reliability of the contact while suppressing cost for connecting a high-voltage board to an image forming unit.

15 Claims, 7 Drawing Sheets

(56) References Cited

FOREIGN PATENT DOCUMENTS

| CN | 2011-60339 Y | 12/2008 |
| JP | 8-340170 | 12/1996 |
| JP | 2003-195697 | 7/2003 |
| JP | 2003-195697 A | 7/2003 |
| JP | 2003195697 A * | 7/2003 ............. G03G 21/00 |

* cited by examiner

FIG. 4A BEFORE FUSION

FIG. 4B AFTER FUSION

☐ : COPPER FOIL PATTERN
▨ : SOLDER PASTE (BEFORE FUSION)
▦ : RESIST

FIG. 8B

CIRCUIT BOARD AND IMAGE FORMING APPARATUS

BACKGROUND OF THE INVENTION

1. Field of the Invention

The present invention relates to a circuit board for feeding power to an apparatus body, and an image forming apparatus using the circuit board.

2. Description of the Related Art

An electrophotographic color image forming apparatus adopts a method of repeatedly performing plural times a process of transferring onto a recording sheet, a toner image formed on an image bearing member through charging, exposure, and development to form a multi-color superimposed image, and then performing a process of fixing the image to obtain a color image.

In the color image forming apparatus, in the process of performing charging and development, plural high voltages such as a charging voltage and a developing voltage are supplied from a high-voltage circuit board (hereinafter referred to as "high-voltage board"). The high-voltage board has plural contacts so as to electrically connect the plural high voltages to an image forming unit including a charging device, a developing device, a primary transfer roller, and a secondary transfer roller of an apparatus body.

When cables are used for electrically connecting the contacts to the image forming unit, it is necessary to connect the cables to the high-voltage board, and hence, it takes time for connection. Further, cost may increase due to the use of the plural cables. Therefore, as a method of solving the problems, for example, there has been proposed a configuration in which an image forming apparatus body includes spring contacts made of an elastic member in a coil spring shape, and copper foil patterns are formed at predetermined positions on a high-voltage board corresponding to the spring contacts so that the spring contacts are brought into contact with the copper foil patterns on the high-voltage board. When the high-voltage board is mounted to the image forming apparatus body, the spring contacts and the copper foil patterns come into press-contact with each other to be connected electrically (see, for example, Japanese Patent Application Laid-Open No. 2003-195697). Thus, the high-voltage board and the image forming unit can be electrically connected without using cables.

However, the image forming apparatus disclosed in Japanese Patent Application Laid-Open No. 2003-195697 has the following problems. In the case where solder is not applied to the copper foil patterns serving as contacts on the high-voltage board, the copper foil patterns corrode to cause contact failure between the copper foil patterns and the spring contacts. On the other hand, in the case where solder is applied to the copper foil patterns, the solder contains a highly insulating substance called flux which remains on the surface of the solder when the solder is melted by heating, resulting in contact failure between the copper foil patterns and the spring contacts. In order to remove the flux remaining on the surface, it is necessary to scrape off the flux after melting by heating and to wipe out the flux with alcohol or the like, which complicates the production process of a high-voltage board, leading to an increase in cost.

SUMMARY OF THE INVENTION

The present invention has been made in view of the above-mentioned circumstances so as to enhance contact reliability of a contact while suppressing cost for connecting a high-voltage board to an image forming unit.

To solve the problems described above, in the present invention, they are provided as follows.

(1) A circuit board for supplying power to a unit in an image forming apparatus through a contact member of a line connected to the unit, the circuit board including a contact configured to contact the contact member for supplying power to the contact member, wherein the contact includes plural copper foil patterns formed radially from a center of the contact and connected with each other at the center of the contact, each of the plural copper foil patterns having a predetermined width.

(2) A circuit board for supplying power to a unit in an image forming apparatus through a contact member of a line connected to the unit, said circuit board including a contact configured to contact the contact member for supplying power to the contact member, characterized in that the contact includes an even number N of plural copper foil patterns each having a predetermined width, the even number N of plural copper foil patterns being formed radially from a center of the contact, each of the even number N of plural copper foil patterns is connected to only adjacent one of the even number N of plural copper foil patterns at the center to form N/2 pairs, and outermost circumferential portions of the even number N of plural copper foil patterns are connected to each other with one copper foil pattern.

(3) An image forming apparatus, including an image forming unit for forming an image; and a circuit board for supplying power to the image forming unit through a contact member of a line connected to the image forming unit, wherein the circuit board includes a contact configured to contact the contact member for supplying power to the image forming unit through the contact member, and wherein the contact includes plural copper foil patterns formed radially from a center of the contact and connected with each other at the center of the contact, each of the plural copper foil patterns having a predetermined width, wherein the contact comprises plural copper foil patterns each having a predetermined width, the plural copper foil patterns being formed radially from a center of the contact and connected with each other at the center of the contact.

(4) An image forming apparatus, including an image forming unit for forming an image, and a circuit board for supplying power to the image forming unit through a contact member of a line connected to the image forming unit, wherein the circuit board includes a contact configured to contact the contact member for supplying power to the image forming unit through the contact member, wherein the contact comprises an even number N of plural copper foil patterns each having a predetermined width, the even number N of plural copper foil patterns being formed radially from a center of the contact, wherein each of the even number N of plural copper foil patterns is connected to only adjacent one of the even number N of plural copper foil patterns at the center to form N/2 pairs, and wherein outermost circumferential portions of the even number N of plural copper foil patterns are connected with each other with one copper foil pattern.

Further features of the present invention will become apparent from the following description of exemplary embodiments with reference to the attached drawings.

DESCRIPTION OF THE EMBODIMENTS

Exemplary embodiments of the present invention are described below.

First Embodiment (Configuration of Image Forming Apparatus)

Figure 1A:
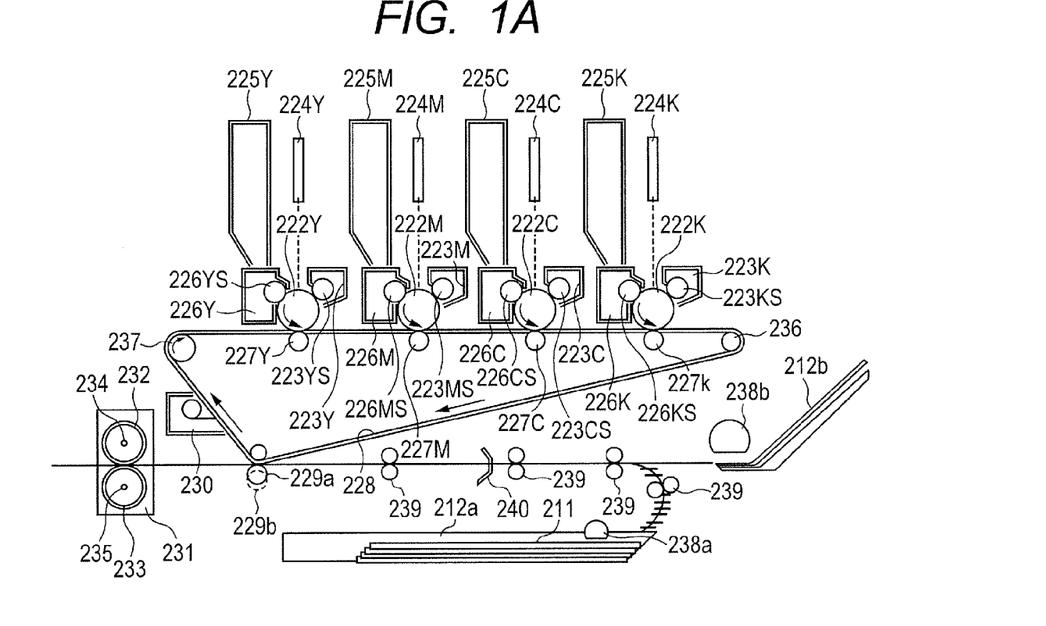
FIG. 1A is a sectional view illustrating a structure of an image forming apparatus according to first to third embodiments of the present invention.

FIG. 1A is a sectional view of a tandem-type color image forming apparatus adopting an intermediate transfer member, which includes image forming units of four colors: yellow (Y), magenta (M), cyan (C), and black (K) according to this embodiment. An image forming operation of an electrophotographic color image forming apparatus is described with reference to FIGS. 1A and 1B.

A sheet feeding cassette 212a and a feed tray 212b receive a recording material 211. The recording material 211 is fed by a feed roller 238a when being received by the sheet feeding cassette 212a and is fed by a feed roller 238b when being received by the feed tray 212b. A conveyance sensor 240 detects whether or not the recording material 211 is being conveyed at a predetermined timing, and when detecting that the recording material 211 is not being conveyed at the predetermined timing, notifies a video controller and the like (not shown) of various jams (for example, conveyance delay jam).

Electrostatic latent images are formed on surfaces of photosensitive drums 222Y, 222M, 222C, and 222K (Y, M, C, and K respectively represent yellow, magenta, cyan, and black, and are sometimes omitted hereinafter) serving as image bearing members. The photosensitive drum 222 includes an organic photoconductive layer applied to a circumference of an aluminum cylinder and is rotated by a drive motor (not shown), and the drive motor rotates the photosensitive drum 222 in a counterclockwise direction in accordance with the image forming operation. A charging device 223 charges the photosensitive drum 222, and the respective charging devices include charging rollers 223YS, 223MS, 223CS, and 223KS.

Figure 1B:
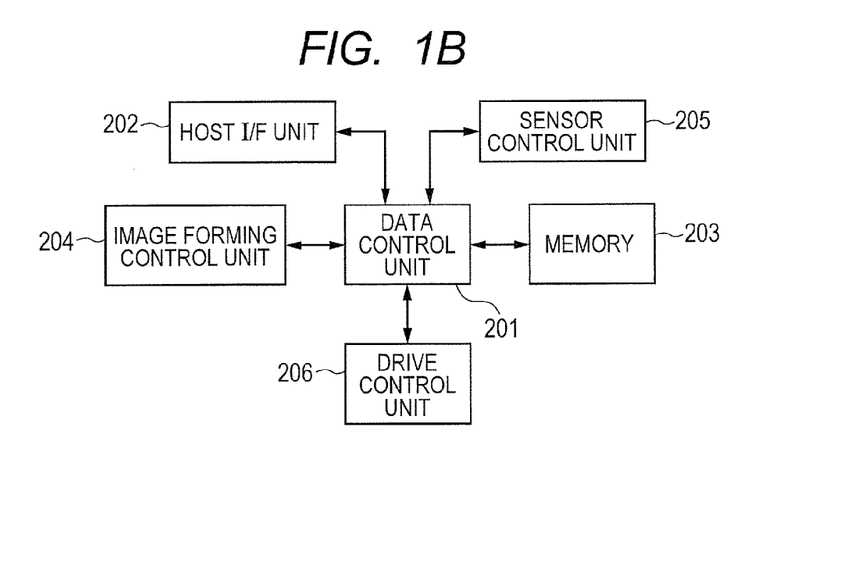
FIG. 1B is a diagram illustrating a configuration of a control unit of the image forming apparatus according to the first to third embodiments of the present invention.

A laser scanner 224 irradiates the photosensitive drum 222 with exposure light from a light-emitting element such as a laser diode in accordance with an exposure time set by a data control unit 201 illustrated in FIG. 1B to form an electrostatic latent image. A toner container 225 sends toner of each color to a developing device 226, and the developing device 226 visualizes the electrostatic latent image as a toner image. Four developing devices 226 perform development of yellow (Y), magenta (M), cyan (C), and black (K) for each station, and the developing devices 226 respectively include developing rollers 226YS, 226MS, 226CS, and 226KS. Note that, each developing device 226 can be removably mounted to the image forming apparatus body.

A primary transfer roller 227 transfers the toner image on the photosensitive drum 222 onto an intermediate transfer member 228. The intermediate transfer member 228 bears the transferred toner image, a drive roller 237 conveys the intermediate transfer member 228 in a driving manner, and a driven roller 236 conveys the intermediate transfer member 228 in a driven manner. A monochromatic toner image is transferred onto the intermediate transfer member 228 with high efficiency by applying an appropriate primary transfer voltage to the primary transfer roller 227 and giving a difference between a rotation velocity of the photosensitive drum 222 and a rotation velocity of the intermediate transfer member 228. This is called primary transfer. The drive roller 237 is rotated in a clockwise direction by a drive motor (not shown).

A secondary transfer roller 229a (229b) transfers the toner image transferred to the intermediate transfer member 228 onto the recording material 211. That is, the recording material 211 is fed from the sheet feeding cassette 212a by the feed roller 238a and conveyed to the secondary transfer roller 229a while being nipped by at least one pair of conveyance rollers 239, and a multi-color toner image on the intermediate transfer member 228 is transferred onto the recording material 211. An appropriate secondary transfer voltage is applied to the secondary transfer roller 229a to transfer a toner image electrostatically. This is called secondary transfer. The secondary transfer roller 229a (229b) comes into abutment on the recording material 211 at a position of "229a" while the multi-color toner image is being transferred onto the recording material 211, and after the toner image is transferred, the secondary transfer roller 229a (229b) moves to a position of "229b" away from the recording material 211.

A fixing device 231 includes a fixing roller 232 for heating the recording material 211 and a pressure roller 233 for bringing the recording material 211 into press-contact with the fixing roller 232 so that the multi-color toner image transferred to the recording material 211 is melted and fixed onto the recording material 211. The fixing roller 232 and the pressure roller 233 are formed into a hollow shape and respectively contain heaters 234 and 235. The fixing device 231 conveys the recording material 211 bearing the multi-color toner image by the fixing roller 232 and the pressure roller 233 and applies heat and pressure to the recording material 211 to fix the toner image onto the recording material 211. A cleaning unit 230 removes toner remaining on the intermediate transfer member 228, and the toner remaining after the multi-color toner image of four colors formed on the intermediate transfer member 228 is transferred onto the recording material 211 is stored in a cleaner container (not shown). The recording material 211 having the toner fixed thereto is then delivered to a delivery tray (not shown) by a delivery roller (not shown), and thus the image forming operation is completed.

(Configuration of Control Unit)

A configuration of a control unit is hereinafter described. FIG. 1B is a diagram illustrating a configuration of the control unit of the image forming apparatus of this embodiment. The data control unit 201 is formed of a one-chip microcomputer or the like and controls and manages the entire apparatus. A host I/F unit 202 causes the image forming apparatus to communicate with a personal computer (hereinafter referred to as "PC"). A memory 203 holds print data, various parameters, various pieces of information, and the like, and an image forming control unit 204 converts the print data sent from the PC to the image forming apparatus into data suitable for a printer engine system. A sensor control unit 205 detects a state of a sheet detecting sensor or the like, and a drive control unit 206 drives and controls actuators, a laser, a drive motor, and the like of the printer engine.

The data to be printed is sent from the PC to the image forming apparatus via the host I/F unit 202, and data conversion in accordance with the printer engine system is completed in the image forming control unit 204 so that the data is ready to be printed. Then, the drive control unit 206 starts drive of the photosensitive drum 222 and the intermediate transfer member 228 connected to a drive unit including a motor and a gear (not shown). Next, an image signal of each color is sent to the laser scanner 224 of each color, and an electrostatic latent image is formed on the photosensitive drum 222. Then, the toner is developed by the developing device 226. After that, the primary transfer and the secondary transfer illustrated in FIG. 1A are performed successively.

(Connection of High-voltage Contacts on High-voltage Board)

Figure 2:
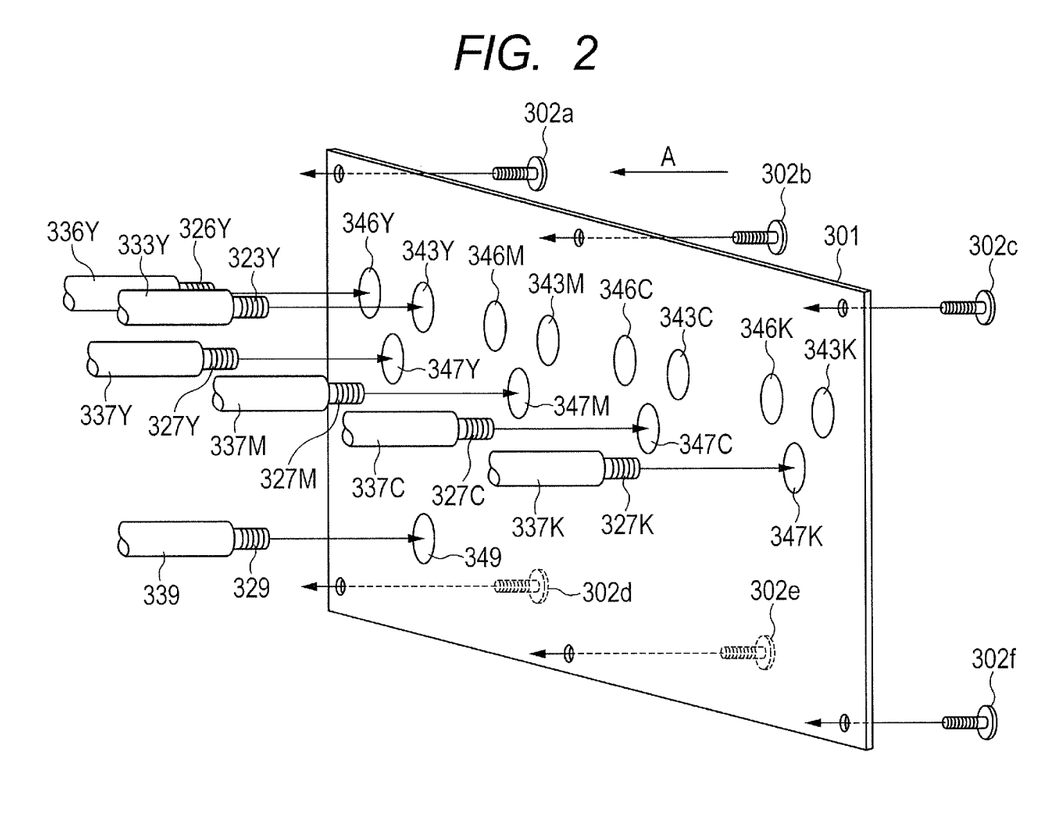
FIG. 2 is a view illustrating connection between image forming units and high-voltage contacts on a high-voltage circuit board according to the first to third embodiments of the present invention.

FIG. 2 is a view illustrating connection between spring contacts (contacting members) connected to the charging device and the like and high-voltage contacts on a high-voltage board in the image forming apparatus of this embodiment. A high-voltage board 301 that is a connection board for supplying a high voltage. Spring contacts 323, 326, 327, and 329 are elastic members in a coil spring shape, and spring contact support members 333, 336, 337, and 339 are formed of insulating members and hold the spring contacts 323, 326, 327, and 329. As described above, Y, M, C, and K in the figure respectively represent yellow, magenta, cyan, and black and are sometimes omitted hereinafter. High-voltage contacts 343, 346, 347, and 349 are respectively provided at predetermined positions on the high-voltage board 301 so as to correspond to the spring contacts 323, 326, 327, and 329, and screws 302a to 302f fix the high-voltage board 301 to the image forming apparatus body. In FIG. 2, only the spring contacts 323Y, 326Y, 327Y, and 329Y are shown as the spring contacts of yellow color. In FIG. 2, although the spring contacts 323, 326, 327, and 329 for other colors are not shown, they are provided similarly to the case of the spring contacts 323Y and 326Y and the spring contact support members 333Y and 336Y of those of the yellow in FIG. 2. Further, a direction in which the high-voltage board 301 is directed to the spring contact 323 and the like is indicated by an arrow A.

The spring contacts 323, 326, 327, and 329 are respectively connected to the charging device 223, the developing device 226, the primary transfer roller 227, and the secondary transfer roller 229a illustrated in FIG. 1A. Then, by mounting the high-voltage board 301 to the image forming apparatus body, the high-voltage contacts 343, 346, 347, and 349 are respectively connected to the spring contacts 323, 326, 327, and 329. After that, a high voltage is supplied from the high-voltage board 301 to the spring contacts 323, 326, 327, and 329. In the following description, the spring contacts 323, 326, 327, and 329 are described collectively as a spring contact 600, and the high-voltage contacts 343, 346, 347, and 349 are described collectively as a high-voltage contact 700.

(State of High-voltage Contacts Before and After Solder Paste is Melted by Heating)

Figure 3A:
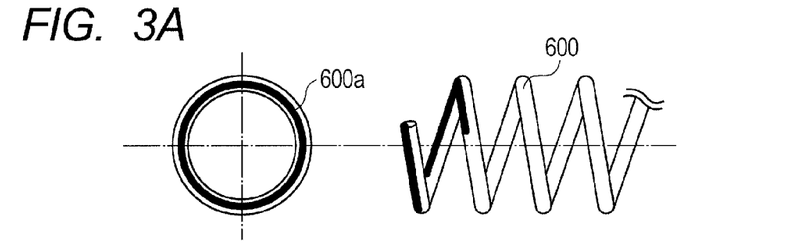
FIG. 3A is a view illustrating a spring as the contact member in a cut-off shape by grinding according to the first embodiment of the present invention.

FIG. 3A shows a spring contact 600 as a contact member. The end portion 600a of the spring contact 600 is cut off as shown as a black area in FIG. 3A, so as to form a substantially flat when the spring is compressed (hereinafter referred to as "cut-off shape").

When the spring contact 600 corresponding to the spring contact 323, 326, 327 and 329 is inserted into the high-voltage contact 700 corresponding to the high-voltage contacts 343, 346, 347, and 349, the spring contact 600 contacts the high-voltage contact 700, as explained later.

Figure 3B:
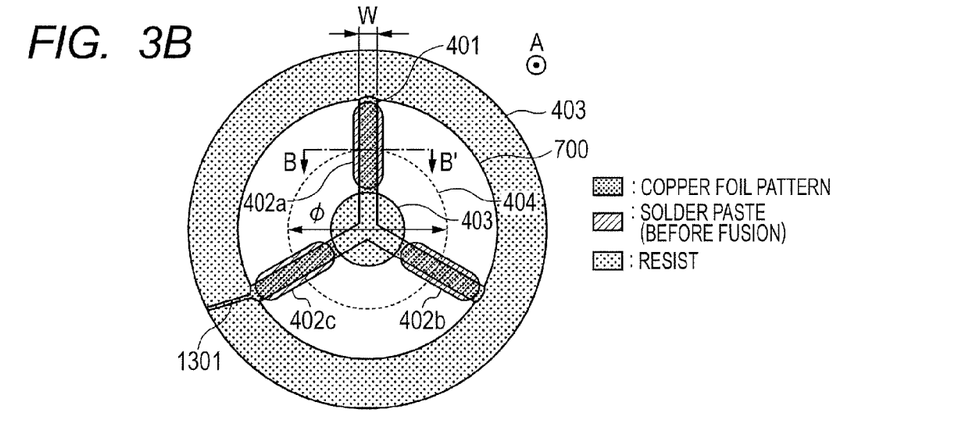
FIGS. 3B and 3C illustrate states of solder paste at the high-voltage contacts before and after melting by heating according to the first embodiment of the present invention.

FIG. 3B is a view illustrating a state of the high-voltage contact 700 on the high-voltage board 301 before solder paste is melted by heating. Copper foil patterns 401 are formed of a conductive copper foil, and solder pastes 402a, 402b, and 402c before melting are represented by hatched regions shown in the figure. A resist 403 is represented by dots regions shown in the figure and is non-conductive. A circle 404 represented by a dotted line indicates a line obtained by connecting portions in which the center of the spring contact 600 is in contact with the high-voltage contact 700. The description is made below with a diameter of the circle 404 set as "Φ". The copper foil patterns 401 having a predetermined width W cross the spring contact 600 (provided that W>0). The symbol "A" in FIG. 3B corresponds to the arrow A of FIG. 2. FIG. 3B illustrates a view of the high-voltage board 301 on the side of the surface on which the spring contact 600 as the spring contacts 323Y, 326Y, 327Y, 329 is inserted to contact the in FIG. 2.

As illustrated in FIG. 3B, the copper foil patterns 401 are formed radially from the center equiangularly. A spring is elastically deformed, and hence, the position of the spring that comes into contact with the high-voltage contact 700 changes on a plane of the high-voltage board 301. When the copper foil patterns 401 are formed radially and equiangularly, even if the contact position of the spring contact 600 moves on the high-voltage contact 700, at least one point of the radial copper foil patterns 401 is capable of being connected to the spring, which can greatly enhance the reliability of the contact. The resist 403 is applied to the center portion and the outermost circumferential portions of the copper foil patterns 401. Note that, a circle illustrated as the high-voltage contact 343 or the like in FIG. 2 corresponds to the high-voltage contact 700 of FIG. 3B, and the resist in the outermost circumferential portions is formed on the circumference of the circular high-voltage contact 700. Thus, the strength of the copper foil patterns 401 is enhanced, and pattern separation and the like can be reduced. The solder paste 402 of the high-voltage contact 700 is applied in a wider region as compared to the width W of the copper foil patterns 401. One of the radial copper foil patterns 401 is connected to a high-voltage circuit signal pattern 1301.

Figure 3C:
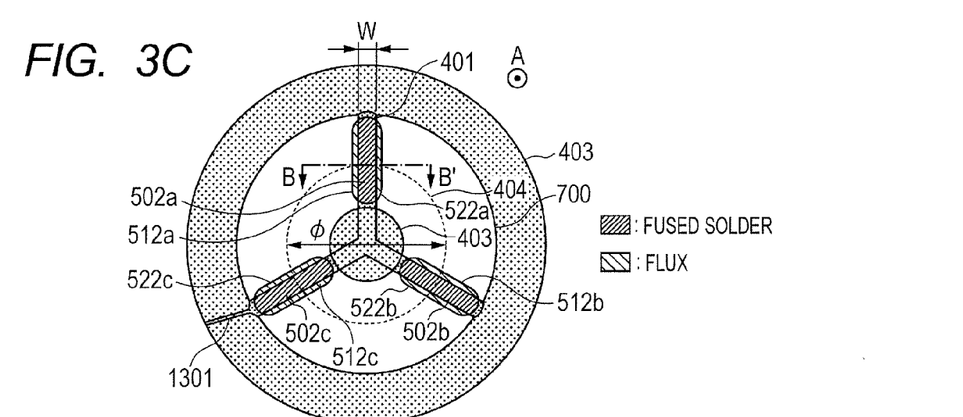

FIG. 3C is a view illustrating a state of the high-voltage contact 700 on the high-voltage board 301 after the solder paste 402 is melted by heating. Only the difference from FIG. 3B is described. Solders 502a, 502b, and 502c after melting by heating are represented by regions shown with hatching in the figure, and fluxes 512a, 512b, 512c, 522a, 522b, and 522c after melting by heating are represented by regions in a grid shape in the figure. The solder paste is separated into a highly insulating flux contained in the solder paste 402 in advance and conductive solder through melting by heating generally called a reflow method. The detail of the solder paste 402 before and after melting by heating is described later with reference to FIGS. 4A and 4B. Note that, melting by heating of the solder paste 402 on the high-voltage contact 700 can be performed by the same process as that of the melting by heating when an electric element (not shown) arranged on the surface of the same high-voltage board is soldered with solder paste.

(State of Solder Paste Before and After Melting by Heating)

Figure 4A:
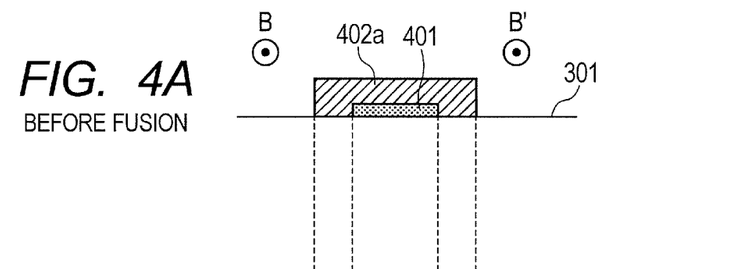
FIGS. 4A and 4B are sectional views illustrating shapes of the solder paste on the high-voltage board before and after melting by heating according to the first to third embodiments of the present invention.
Figure 4B:
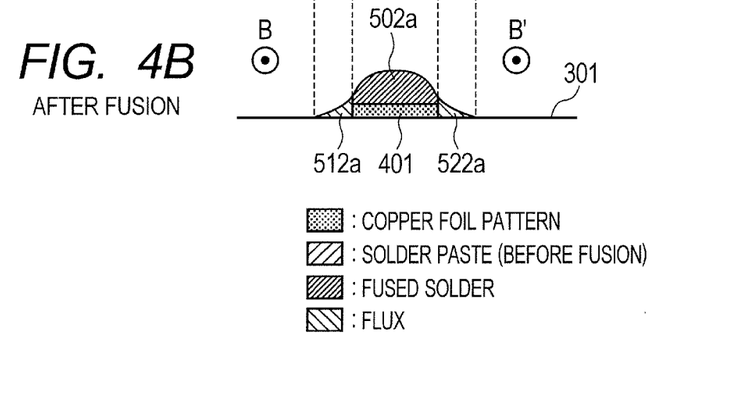

FIGS. 4A and 4B are sectional views illustrating a state of solder paste before and after melting by heating on the high-voltage board 301. As illustrated in FIG. 4A, the solder paste 402a before melting is applied to the copper foil patterns 401 on the high-voltage board 301. Further, as illustrated in FIG. 4B, the solder 502a after melting by heating and the highly insulating fluxes 512a and 522a are formed by subjecting the solder paste 402a to melting by heating. The symbols "B" and "B'" correspond to arrows B and B' in FIGS. 3B and 3C. When the solder paste 402a applied in a wider region as compared to the width W of the copper foil patterns 401 is melted by heating, the solder paste 402a is separated into a flux and solder, and surface tension occurs on the solder surface. Therefore, the melted solder 502a is concentrated on the copper foil patterns 401, and the fluxes 512a and 522a flow down to the circumference of the copper foil patterns 401. Thus, only the conductive solder 502a remains on the copper foil patterns 401 that come into contact with the spring contact 600, and fluxes do not remain on the copper foil patterns 401.

As described above, according to this embodiment, the contact reliability of contacts can be enhanced while suppressing cost for connecting the high-voltage board to the image forming unit.

Second Embodiment

Only the difference from the first embodiment of the present invention is described. FIGS. 1A, 1B, 2, 4A, and 4B are also applied to this embodiment. In the first embodiment of the present invention, regarding the shape of the radial copper foil patterns 401 of the high-voltage contact 700, the size of the spring that comes into contact with the high-voltage contact 700 is not considered. This embodiment has a feature in that the shape of the copper foil patterns 401 of the high-voltage contact 700 is determined based on the size of the spring.

(End Shape of Spring)

As the end shape of a spring, a cut-off shape (FIG. 3A) and a non-cut-off shape have been generally known. The ground shape refers to the shape obtained by grinding the end of a spring into a planar shape, which can enlarge a contact surface between the spring and the high-voltage contact while leading to a complicated production step of the spring and an increase in cost.

Figure 5:
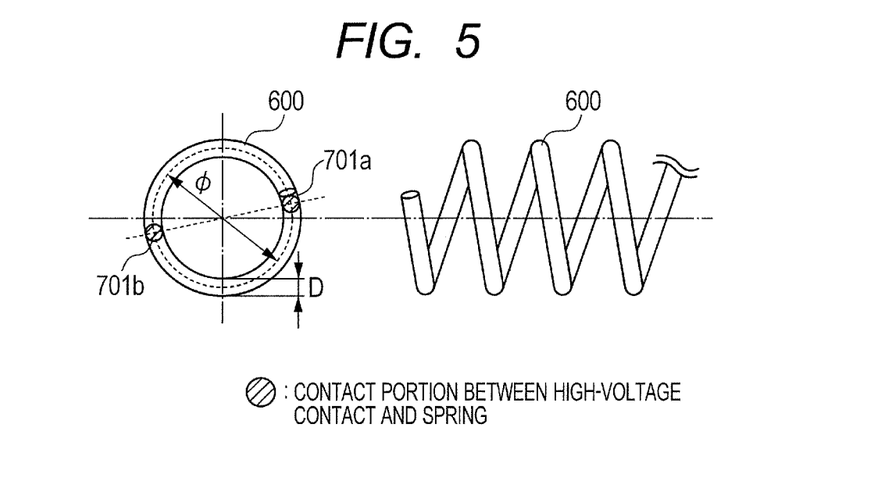
FIG. 5 is a view illustrating a spring as the contact member in a non-cut-off shape by grinding according to the second and third embodiments of the present invention.

FIG. 5 is a view illustrating a spring in a non-cut-off shape according to this embodiment. The spring has a wire diameter D and a diameter $\Phi$ of a center line of a portion in which the spring comes into contact with the high-voltage contact 700. The diameter $\Phi$ is the same as the diameter $\Phi$ of the circle 404 of FIGS. 3B and 3C. Circular contact portions 701a and 701b between the spring contact 600 and the high-voltage contact 700 are represented by lattice regions in the figure. The non-ground shape is a shape in which the end of the spring is not processed, which can prevent an increase in cost while causing a constraint in a contact surface of the spring. The contact surface of the spring is not a plane, and hence, only two points illustrated in FIG. 5, that is, the contact portion 701a of the end of the spring and the contact portion 701b to be point-symmetrical with the contact portion 701a with respect to the center of the spring, may come into contact.

(Contact State Between High-voltage Contact and Spring Contact After Solder Paste is Melted by Heating in the First Embodiment of the Present Invention)

Figure 6A:
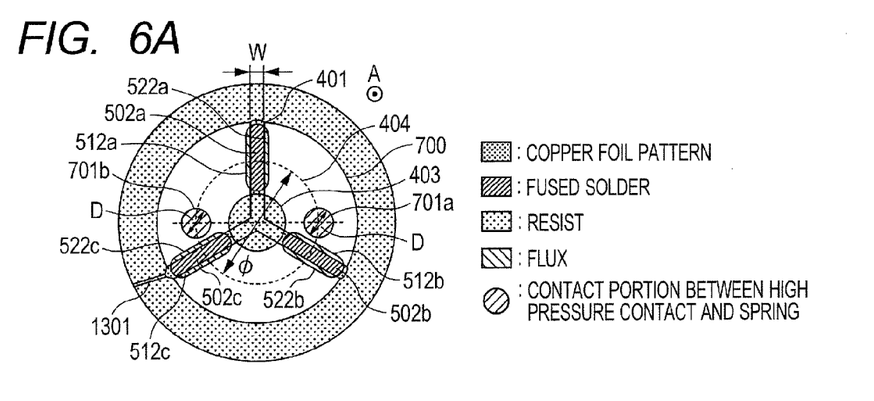
FIGS. 6A, 6B, 6C, and 6D are a view illustrating a contact state between the high-voltage contacts and spring contacts after melting by heating, views illustrating states of the high-voltage contacts before and after melting by heating, and a view illustrating an expression of a distance L according to the second embodiment of the present invention.

FIG. 6A is a view illustrating a contact state between the high-voltage contact 700 on the high-voltage board 301 and the spring contact 600 after the solder paste 402 is melted by heating in the first embodiment of the present invention. The shape of the high-voltage contact 700 is the same as that of the first embodiment of the present invention, and the description thereof is omitted herein. As illustrated in FIG. 5, the contact portions 701a and 701b are point-symmetrical with respect to the center of the spring, and the position of the end of the spring with respect to the center of the spring is not defined in advance. Therefore, there is a possibility that all the positions at an angle of 360° with respect to the center of the spring become contact portions between the spring contact 600 and the high-voltage contact 700. In the case of the position of the end of the spring illustrated in FIG. 6A, the contact portions 701a and 701b between the high-voltage contact 700 and the spring contact 600 do not overlap the solders 502a, 502b, and 502c on the copper foil patterns 401, and hence, electrical connection as contacts cannot be ensured sufficiently.

(Configuration of High-voltage Contact Before Solder Paste is Melted by Heating)

Figure 6B:
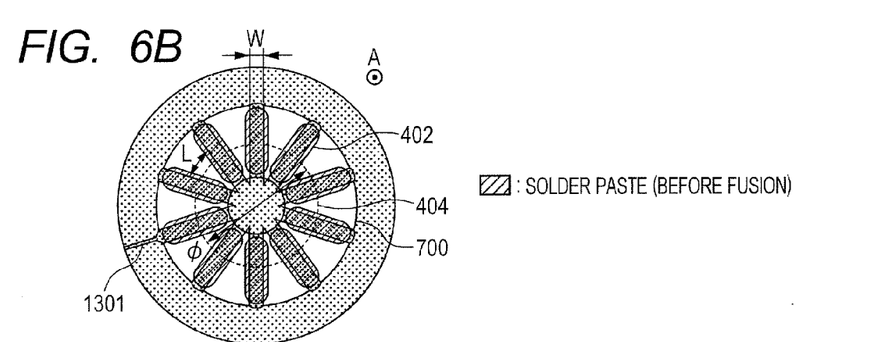

This embodiment is hereinafter described. FIG. 6B is a view illustrating a state of the high-voltage contact 700 on the high-voltage board 301 before the solder paste 402 is melted by heating according to this embodiment. In this embodiment, the high-voltage contact 700 is formed so as to satisfy the following conditional expression:

$$L<D \quad (1\text{-}1)$$

where D represents a wire diameter of a spring, which is as illustrated in FIG. 5. When L represents a distance between the adjacent end portions of the copper foil patterns 401 in the circle 404 of the center line in a portion in which the spring contact 600 comes into contact with the high-voltage contact 700, and N represents the number of the radial copper foil patterns 401, the L and N are defined by the following expressions:

When $N=2n+1$, $$L=\{\pi \times \Phi/(N \times 2)\}-W \quad (1\text{-}2)$$

When $N=2n$, $$L=(\pi \times \Phi/N)-W \quad (1\text{-}3)$$

where n is a positive integer and can be determined arbitrarily. As described above, $\Phi$ represents a diameter of the center line in the portion in which the spring comes into contact with the high-voltage contact 700, and W represents a width of the copper foil pattern 401 crossing the spring contact 600. The expressions (1-2) and (1-3) are described with reference to FIG. 6D. In FIG. 6D, the copper foil patterns 401 of only a hatched portion correspond to the case where N=5, and the copper foil patterns 401 of the hatched portion and a broken line portion correspond to the case where N=10. In this case, L=D. In the case where N=5, the copper foil patterns 401 are not arranged diagonally, and hence, the distance L is considered to be a half. That is, in the case where N=5, it is appropriate that any one of the contact portions 701a, 701b come into contact with any one of the close copper foil patterns 401, and hence, this arrangement may be considered to be substantially the same as the arrangement of the copper foil patterns in the case where N=10. Thus, in the case where N=5 (odd number), the expression (1-2) is applied. In the case where N=10, both of the contact portions 701a, 701b are close to the copper foil patterns 401, and hence, the expression (1-3) is applied.

In FIG. 6B, as an example, the case where n=5 and N=10 is described, and the expression (1-3) is applied. Thus, the following expression is established:

$$L=(\pi \times \Phi/10)-W \quad (1-4)$$

The solder paste application region represented by the hatched region in the figure, to which the solder paste 402 is applied, is set to be wider than the width W of the copper foil pattern 401 in the same way as in the first embodiment of the present invention.

(Contact State Between High-voltage Contact and Spring Contact After Solder Paste is Melted by Heating)

Figure 6C:
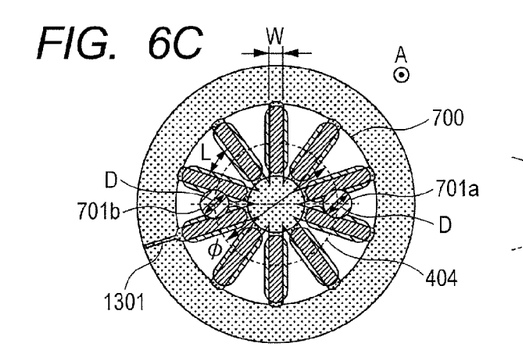
Figure 6D:
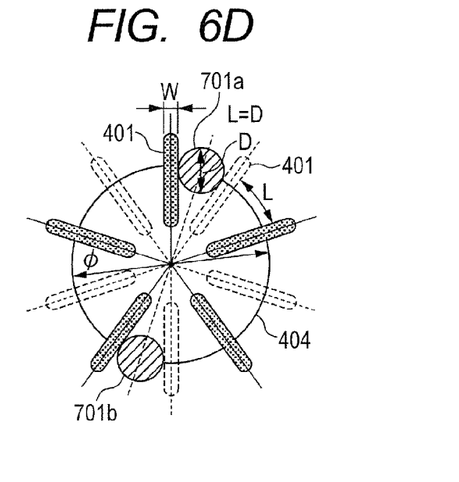

FIG. 6C is a view illustrating a contact state between the high-voltage contact 700 on the high-voltage board 301 and the spring contact 600 after melting by heating according to this embodiment. When the high-voltage contact 700 described in FIG. 6B is melted by heating, as illustrated in FIGS. 4A and 4B, the solder paste is separated into a flux and solder. The solder is concentrated on the copper foil patterns 401, and the flux flows down to the circumference of the copper foil patterns 401. In the case where the spring in a non-ground shape illustrated in FIG. 5 comes into contact with the high-voltage contact 700, even when the end of the spring is arranged at any position at an angle of 360° with respect to the center of the spring, the expression (1-1) holds. Therefore, at least one of the contact portions 701a, 701b of the spring contact 600 and the high-voltage contact 700 overlaps the solder on the copper foil pattern 401.

According to this embodiment, the contact reliability of contacts can be enhanced while suppressing cost for connecting the high-voltage board to the image forming unit.

Third Embodiment

Only the difference from the first and second embodiments of the present invention is described. FIGS. 1A, 1B, 2, 4A, 4B, and 5 are also applied to this embodiment. In the first and second embodiments of the present invention, only one of the radial copper foil patterns 401 is connected to the high-voltage circuit signal pattern 1301. However, in this embodiment, the outermost circumferential portions of the radial copper foil pattern 401 are connected to each other with a copper foil pattern. The end shape of a general spring including the spring illustrated in FIG. 5 is sharp, and when the spring comes into contact with the high-voltage contact 700, the spring may elastically change to damage the patterns of the high-voltage contact 700.

(Contact State Between High-voltage Contact and Spring Contact After Solder Paste is Melted by Heating in the Second Embodiment of the Present Invention)

Figure 7A:
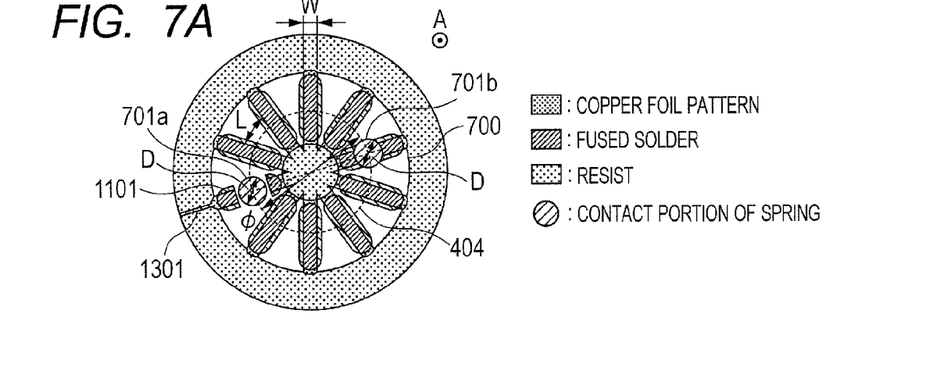
FIGS. 7A, 7B, and 7C are a view illustrating a contact state between the high-voltage contacts and the spring contacts after melting by heating, and views illustrating states of the high-voltage contacts before and after melting by heating according to the third embodiment of the present invention.

FIG. 7A is a view illustrating a contact state between the high-voltage contact 700 on the high-voltage board 301 and the spring contact 600 after the solder paste 402 is melted by heating in the second embodiment of the present invention. The shape of the high-voltage contact 700 is the same as that of FIG. 6C and already described in the second embodiment, and hence, the description thereof is omitted herein. The end portion of a copper foil pattern 1101 is connected to the high-voltage circuit signal pattern 1301. When the spring contact 600 comes into contact with the high-voltage contact 700, and the end of the spring elastically changes to damage the copper foil pattern 1101 of the high-voltage contact 700, the electrical connection of the remaining radial copper foil patterns 401 with respect to the high-voltage circuit signal pattern 1301 is disconnected. After that, when the high-voltage contact 700 is connected to the spring contact 600 in the contact portions 701a, 701b, the copper foil pattern 1101 is disconnected from the contact portion 701a, and hence, the electrical connection as a contact cannot be ensured sufficiently.

(Configuration of High-voltage Contact Before Solder Paste is Melted by Heating)

Figure 7B:
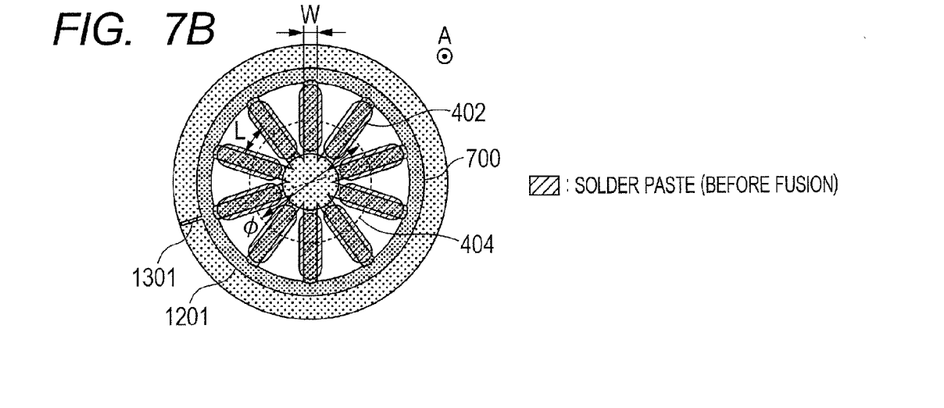

This embodiment is hereinafter described. FIG. 7B is a view illustrating a state of the high-voltage contact 700 on the high-voltage board 301 before the solder paste 402 is melted by heating according to this embodiment. A copper foil pattern 1201 connects the outermost circumferential portions of the radial copper foil patterns 401 to each other. The radical copper foil patterns, the application region of the resist, and the application region of the solder paste 402 are the same as those of FIG. 6B and described in the second embodiment of the present invention, and hence, the descriptions thereof are omitted herein. The outermost circumferential portions of the copper foil patterns 401 formed radially are connected to each other with the copper foil pattern 1201 and connected to the high-voltage circuit signal pattern 1301.

(Contact State Between High-voltage Contact and Spring Contact After Solder Paste is Melted by Heating)

Figure 7C:
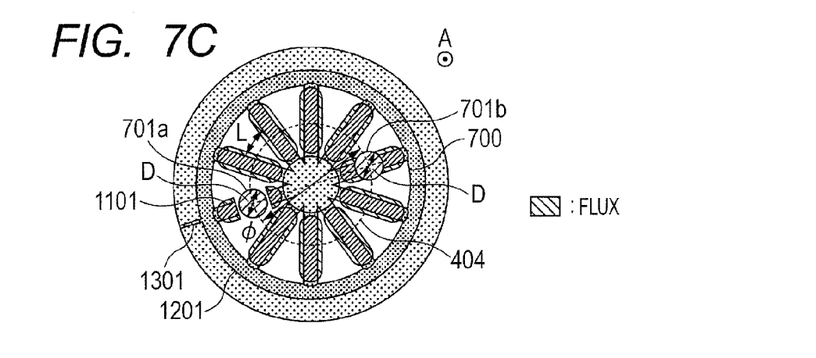

FIG. 7C is a view illustrating a state in which the high-voltage contact 700 on the high-voltage board 301 comes into contact with the spring contact 600 in the contact portions 701a, 701b after the solder paste 402 is melted by heating according to this embodiment. The radial copper foil patterns, the application region of the resist, and the application region of the solder paste are the same as those of FIG. 6B, and hence, the descriptions thereof are omitted. When the spring contact 600 comes into contact with the high-voltage contact 700, the end of the spring may elastically change to damage the copper foil pattern 1101 of the high-voltage contact 700 in the contact portion 701a. In this case, the electrical connection is ensured for the remaining radial copper foil patterns 401 with respect to the high-voltage circuit signal pattern 1301 via the copper foil pattern 1201 connected at the outermost circumferential portions. When the high-voltage contact 700 is connected to the spring contact 600 in the contact portions 701a, 701b, the remaining radial copper foil patterns 401 excluding the radial copper foil pattern 1101 damaged in the contact portion 701a can be electrically connected to the spring contact 600. As described above, by connecting the outermost circumferential portions of the radial copper foil patterns 401 to each other with the copper foil pattern 1201, an image forming apparatus can be provided, in which contact reliability of contacts is greatly enhanced even in the case where the spring damages the copper foil patterns of the high-voltage contact 700. As a result, an image forming apparatus can be provided, in which contact reliability of contacts is greatly enhanced while suppressing an increase in cost of the end shape of the spring.

According to this embodiment, the contact reliability of contacts can be enhanced while suppressing cost for connecting the high-voltage board to the image forming unit.

Other Embodiments (A) Although a contact for supplying a high voltage is described in the present invention, the contact is not limited to the contact for supplying a high voltage as long as it is configured to be electrically connected through contact. For example, a contact for switching a signal line or grounding line (earth line) inside of various consumable units such as a developing unit and a photosensitive drum unit may be used. Further, although an elastic member in a coil spring shape is used as the spring contact 600, an elastic member in a plate spring shape may be used.

(B) Although a four-color image forming apparatus is described in the present invention, the present invention is not limited to a color image forming apparatus as long as the image forming apparatus has a contact. For example, a monochromic image forming apparatus may be used.

(C) Although a tandem-type color image forming apparatus is used in the present invention, the image forming apparatus is not limited to a tandem type as long as the image forming apparatus has a contact. For example, a rotary-type color image forming apparatus including a belt-like intermediate transfer member may be used.

Figure 8A:
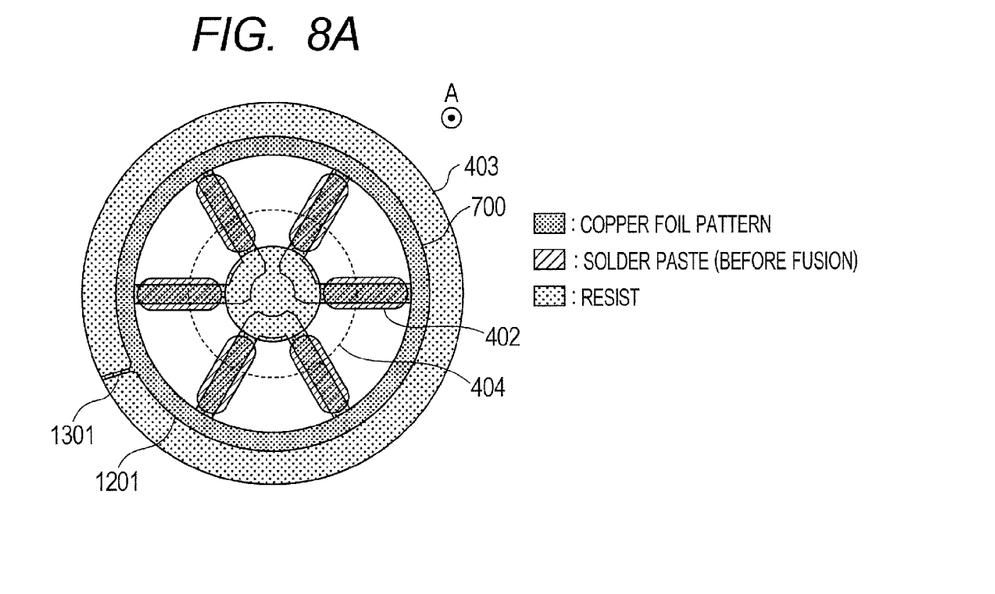
FIGS. 8A and 8B are views illustrating configurations of high-voltage contacts before melting by heating according to other embodiments of the present invention.

(D) Although the copper foil patterns of a contact are connected at one point of the center in the present invention, the connection of the copper foil patterns are not limited to the connection at one point of the center as long as the solder application regions are arranged at equal intervals. For example, as illustrated in FIG. 8A, the copper foil patterns may be connected using a copper foil pattern in a region in the vicinity of the center of the contact. As illustrated in FIG. 8A, an even number N of plural copper foil patterns are formed radially from the center, and the copper foil pattern is connected to only one of the adjacent copper foil patterns in a region in the vicinity of the center of the contact, and thus, N/2 pairs are formed.

Figure 8B:
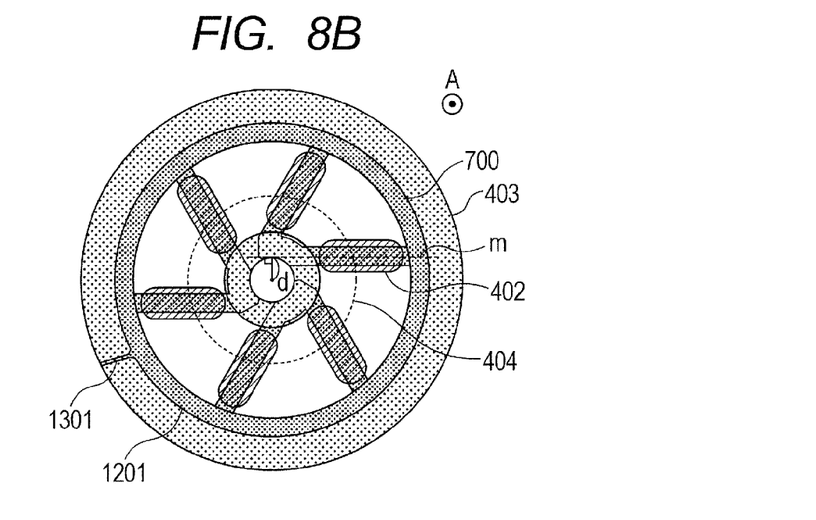

(E) Although the copper foil patterns of a contact are formed radially from the center in the present invention, the copper foil patterns are not limited to be formed radially from the center as long as solder application regions are arranged at equal intervals. For example, as illustrated in FIG. 8B, copper foil patterns may be formed at positions shifted by any distance from the center, and solder paste may be applied to wider regions as compared to the width of the copper foil patterns. As illustrated in FIG. 8B, the copper foil patterns are formed in such a manner that a center line m of the plural copper foil patterns does not pass through the center of the contact, and a length d of a normal to the center line m of the copper foil patterns from the center of the contact becomes constant.

In the other embodiments, the contact reliability of contacts can be enhanced while suppressing cost for connecting the high-voltage board to the image forming unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2012-124689, filed May 31, 2012, and No. 2013-098582, filed May 8, 2013 which are hereby incorporated by reference herein in their entirety.

What is claimed is:

1. A circuit board for supplying power to a unit in an apparatus through a contact member of a line connected to the unit, said circuit board comprising:
a contact including at least three copper foil patterns connected to a center portion and extending radially from the center portion with constant spaces between two adjacent copper foil patterns, each of the at least three copper foil patterns having a predetermined width, and the center of the contact including a center area in which no solder is applied,
wherein one of the at least three copper foil patterns is connected to a signal pattern of a high-voltage circuit,
wherein solder is applied on portions respectively in the at least three copper foil patterns, each of the portions being away from the center portion of the contact, and
wherein the contact member contacts at least one of the portions in the at least three copper foil patterns and does not contact the center area.

2. The circuit board according to claim 1, further comprising a resist applied to the center portion and a circumferential portion of the contact.

3. The circuit board according to claim 1, further comprising a copper foil pattern for mutually connecting outermost circumferential portions of the at least three copper foil patterns at the contact.

4. A circuit board for supplying power to a unit in an apparatus through a contact member of a line connected to the unit, said circuit board comprising:
a contact configured to contact the contact member for supplying power to the contact member
wherein the contact includes an even number N of plural copper foil patterns each having a predetermined width, the even number N of plural copper foil patterns being formed radially from a center of the contact,
wherein each of the even number N of plural copper foil patterns is connected to only adjacent one of the even number N of plural copper foil patterns at the center to form N/2 pairs, and
wherein outermost circumferential portions of the even number N of plural copper foil patterns are connected to each other with one copper foil pattern.

5. The circuit board according to claim 4, wherein the power is supplied through the contact member in a state where the contact member contacts at least one of the N/2 pairs of the even number N of the plural copper foil patterns.

6. The circuit board according to claim 4, wherein a center line of the each of the even number N of plural copper foil patterns avoids passing through the center of the contact, and a length of a normal to the center line of the each of the even number N of plural copper foil patterns from the center of the contact is constant.

7. The circuit board according to claim 4, wherein the even number N is equal to or more than six.

8. An image forming apparatus, comprising:
an image forming unit for forming an image; and
a circuit board for supplying power to the image forming unit through a contact member of a line connected to the image forming unit,
wherein the circuit board includes a contact configured to contact the contact member for supplying power to the image forming unit through the contact member,
wherein the contact includes at least three copper foil patterns connected to a center portion and extending radially from the center portion with constant spaces between two adjacent copper foil patterns, each of the at least three copper foil patterns having a predetermined width, and the center of the contact including a center area in which no solder is applied,
wherein one of the at least three copper foil patterns is connected to a signal pattern of a high-voltage circuit,
wherein solder is applied on portions respectively in the at least three copper foil patterns, each of the portions being away from the center of the contact, and wherein the contact member contacts at least one of the portions in the at least three copper foil patterns and does not contact the center area.

9. The image forming apparatus according to claim 8, wherein the contacting member includes an elastic member in a coil spring shape.

10. The image forming apparatus according to claim 8, wherein the image forming unit includes at least one of:
- a charging unit for charging an image bearing member;
- a developing unit for developing an electrostatic latent image formed on the image bearing member into a toner image;
- a primary transfer unit for transferring the toner image onto an intermediate transfer member; and
- a secondary transfer unit for transferring, onto a recording material, the toner image transferred onto the intermediate transfer member.

11. The image forming apparatus according to claim 10, wherein the even number N is equal to or more than six.

12. An image forming apparatus, comprising:
an image forming unit for forming an image; and
a circuit board for supplying power to the image forming unit through a contact member of a line connected to the image forming unit,
wherein the circuit board includes a contact configured to contact the contact member for supplying power to the image forming unit through the contact member,
wherein the contact comprises an even number N of plural copper foil patterns each having a predetermined width, the even number N of plural copper foil patterns being formed radially from a center of the contact,
wherein each of the even number N of plural copper foil patterns is connected to only adjacent one of the even number N of plural copper foil patterns at the center to form N/2 pairs, and
wherein outermost circumferential portions of the even number N of plural copper foil patterns are connected with each other with one copper foil pattern.

13. The image forming apparatus according to claim 12, wherein the power is supplied through the contact member in a state where the contact member contacts at least one of the N/2 pairs of the even number N of the plural copper foil patterns.

14. The image forming apparatus according to claim 13, wherein the contacting member includes an elastic member in a coil spring shape.

15. The image forming apparatus according to claim 14, wherein the image forming unit includes at least one of:
- a charging unit for charging an image bearing member;
- a developing unit for developing an electrostatic latent image formed on the image bearing member into a toner image;
- a primary transfer unit for transferring the toner image onto an intermediate transfer member; and
- a secondary transfer unit for transferring, onto a recording material, the toner image transferred onto the intermediate transfer member.

* * * * *